United States Patent
Cassels et al.

(10) Patent No.: US 7,668,683 B2
(45) Date of Patent: Feb. 23, 2010

(54) NUMERICAL TEST DATA REPORTING IN AN IMAGE FILE AND SUBSEQUENT ANALYSIS

(75) Inventors: John J. Cassels, Marlboro, NY (US); William J. Ferrante, Hyde Park, NY (US); Stephen Wu, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 188 days.

(21) Appl. No.: 11/847,584

(22) Filed: Aug. 30, 2007

(65) Prior Publication Data

US 2009/0063068 A1 Mar. 5, 2009

(51) Int. Cl.
*G01R 31/00* (2006.01)
(52) U.S. Cl. ...................... 702/120; 702/117
(58) Field of Classification Search .................. 702/117
See application file for complete search history.

(56) References Cited

U.S. PATENT DOCUMENTS 6,907,379 B1 * 6/2005 Wu et al. .................... 702/120
2007/0113134 A1 * 5/2007 Ferrante et al. ............. 714/738

\* cited by examiner

*Primary Examiner*—Bryan Bui
*Assistant Examiner*—Jonathan Teixeira Moffat
(74) *Attorney, Agent, or Firm*—Steven Capella; Hoffman Warnick LLC

(57) ABSTRACT

The present disclosure is directed to numerical test data reporting using an image file and subsequent analysis of the test data. A method for capturing and analyzing test data in accordance with an embodiment includes: capturing multi-bit integer values of test data; writing each multi-bit integer value to a multi-bit vertical field in an image file; extracting the multi-bit integer values from the multi-bit vertical fields in the image file; and analyzing the extracted multi-bit integer values.

15 Claims, 6 Drawing Sheets

NUMERICAL TEST DATA REPORTING IN AN IMAGE FILE AND SUBSEQUENT ANALYSIS

BACKGROUND

The disclosure relates to the testing of integrated circuits, and more specifically relates to numerical test data reporting using an image file and subsequent analysis of the test data.

Integrated circuit testers typically log functional test data in two different ways. One method is by performing a logging of every measurement to an American Standard Code for Information Interchange (ASCII) file. The large amount of functional test data collected using this approach typically requires periodically pausing test execution and queries of the tester hardware during generation of the ASCII file. This results in a very large ASCII file which can take an excessive amount of time to generate and an excessive amount of time to analyze during post-processing.

One approach to address this situation is to limit the number of failures identified to a predefined maximum. Unfortunately, this approach mandates not capturing all of the functional test data. In addition, this approach may add complexity in those cases where the number of failures reaches the predefined maximum. Another approach includes performing a binary dump of the functional data to an image file. Although this can be completed in a much shorter time, the functional data in the image file is not provided in a way that is conducive to statistical analysis during post-processing.

SUMMARY

The disclosure relates to numerical test data reporting using an image file and subsequent analysis of the test data.

A first aspect is directed to a method for capturing and analyzing test data, comprising: capturing multi-bit integer values of test data; writing each multi-bit integer value to a multi-bit vertical field in an image file; extracting the multi-bit integer values from the multi-bit vertical fields in the image file; and analyzing the extracted multi-bit integer values.

A second aspect is directed to a system for capturing and analyzing test data, comprising: a testing system for capturing multi-bit integer values of test data and for writing each multi-bit integer value to a multi-bit vertical field in an image file; and an analyzing system for extracting the multi-bit integer values from the multi-bit vertical fields in the image file, and for analyzing the extracted multi-bit integer values.

A third aspect is directed to a program product stored on a computer readable medium, which when executed, captures and analyzes test data, the computer readable medium comprising program code for: capturing multi-bit integer values of test data; writing each multi-bit integer value to a multi-bit vertical field in an image file; extracting the multi-bit integer values from the multi-bit vertical fields in the image file; and analyzing the extracted multi-bit integer values.

The illustrative aspects of the present disclosure are designed to solve the problems herein described and other problems not discussed.

BRIEF DESCRIPTION OF THE DRAWINGS

These and other features will be more readily understood from the following detailed description taken in conjunction with the accompanying drawings.

Figure 1:
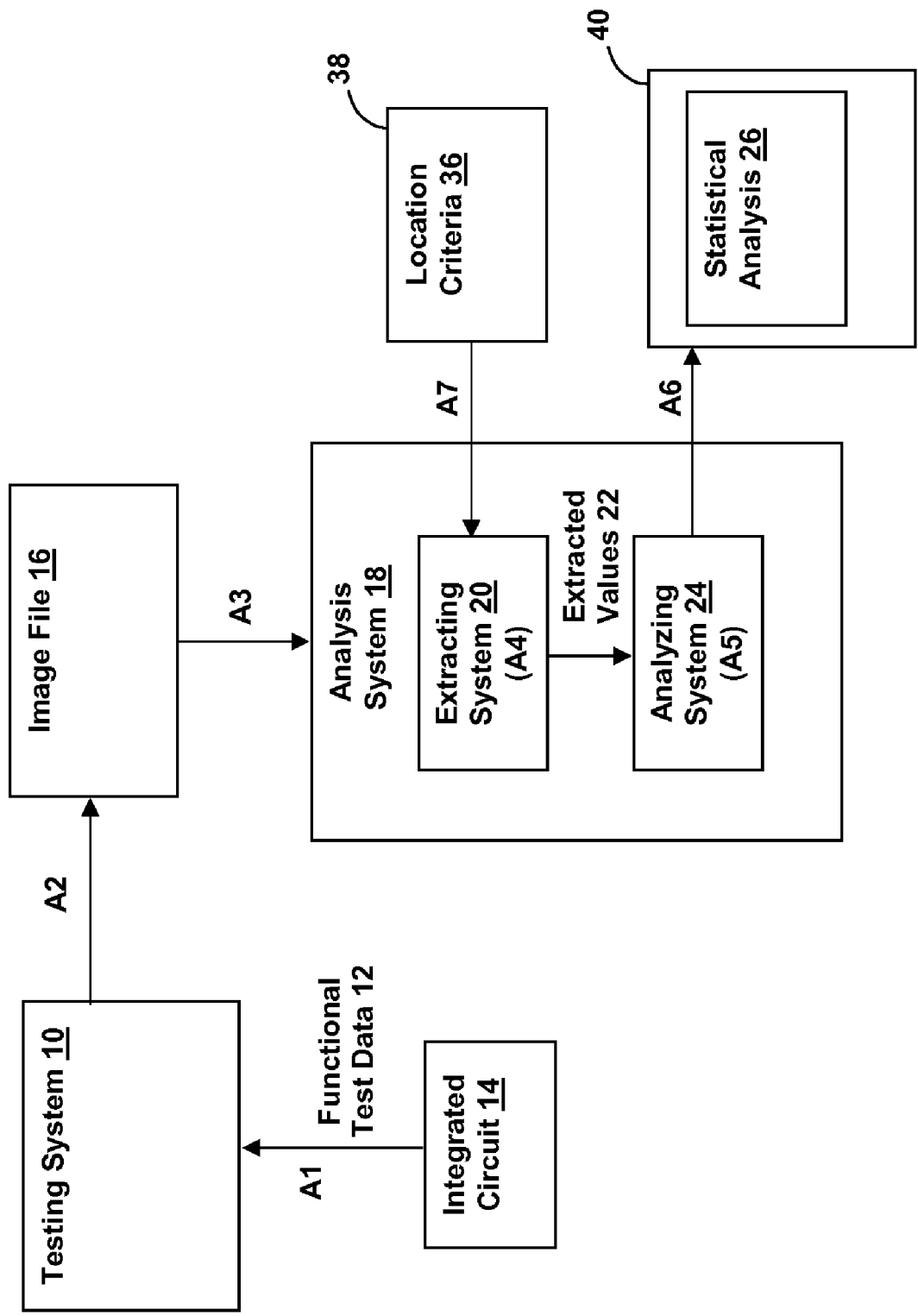
FIG. 1 depicts an illustrative testing system for capturing functional test data of an integrated circuit and for generating an image file in accordance with an embodiment of the disclosure.

The drawings are merely schematic representations, not intended to portray specific parameters of the present disclosure. The drawings are intended to depict only typical embodiments of the disclosure, and therefore should not be considered as limiting the scope of the disclosure. In the drawings, like numbering represents like elements.

DETAILED DESCRIPTION

As detailed above, the disclosure relates to numerical test data reporting using an image file and subsequent analysis of the test data.

FIG. 1 depicts an illustrative testing system 10 for capturing (A1) functional test data 12 of an integrated circuit 14 and for generating (A2) an image file 16 containing the functional test data 12. The image file 16 is provided (A3) to an analysis system 18, which comprises an extracting system 20 for extracting (A4) values 22 from the image file 16 and an analyzing system 24 for analyzing (A5) the extracted values 22 and for outputting (A6) a statistical analysis 26 of the extracted values 22.

The testing system 10 is configured to perform test(s) on the integrated circuit 14 and to capture multi-bit (e.g., 8-bit) integer values of an electrical characteristic at a number of points on the integrated circuit 14. For example, the testing system 10 can capture 8-bit integer resistance values from the integrated circuit 14. Other electrical characteristics, such as voltage, current, inductance, capacitance, power, and/or the like can also be captured by the testing system 10. Any now known or later developed testing system capable of testing an integrated circuit and capturing such electrical characteristics can be used.

The image file 16 generated by the testing system 10 can comprise a Tagged Image File Format (TIFF) file. To this extent, each multi-bit integer value captured by the testing system 10 can be written to a multi-bit vertical field in the image file 16. Alternatively, the image file 16 can be generated using other image formats such as Graphic Interchange Format (GIF), Portable Network Graphic (PNG), Joint Photographic Experts Group (JPEG), and/or the like. The image file 16 can be stored for later analysis.

Figure 2:
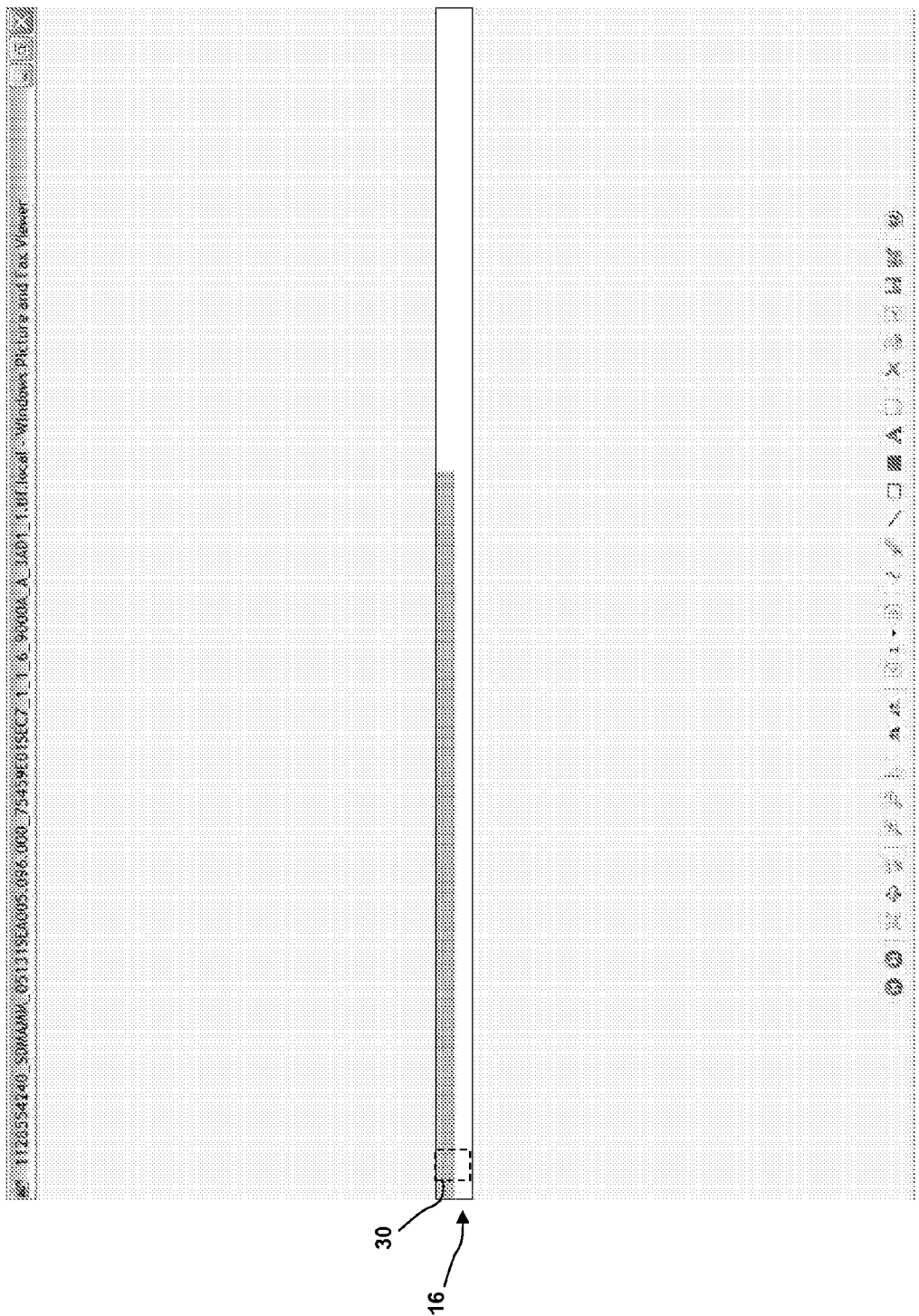
FIG. 2 depicts an illustrative image file in accordance with an embodiment of the disclosure.
Figure 3:
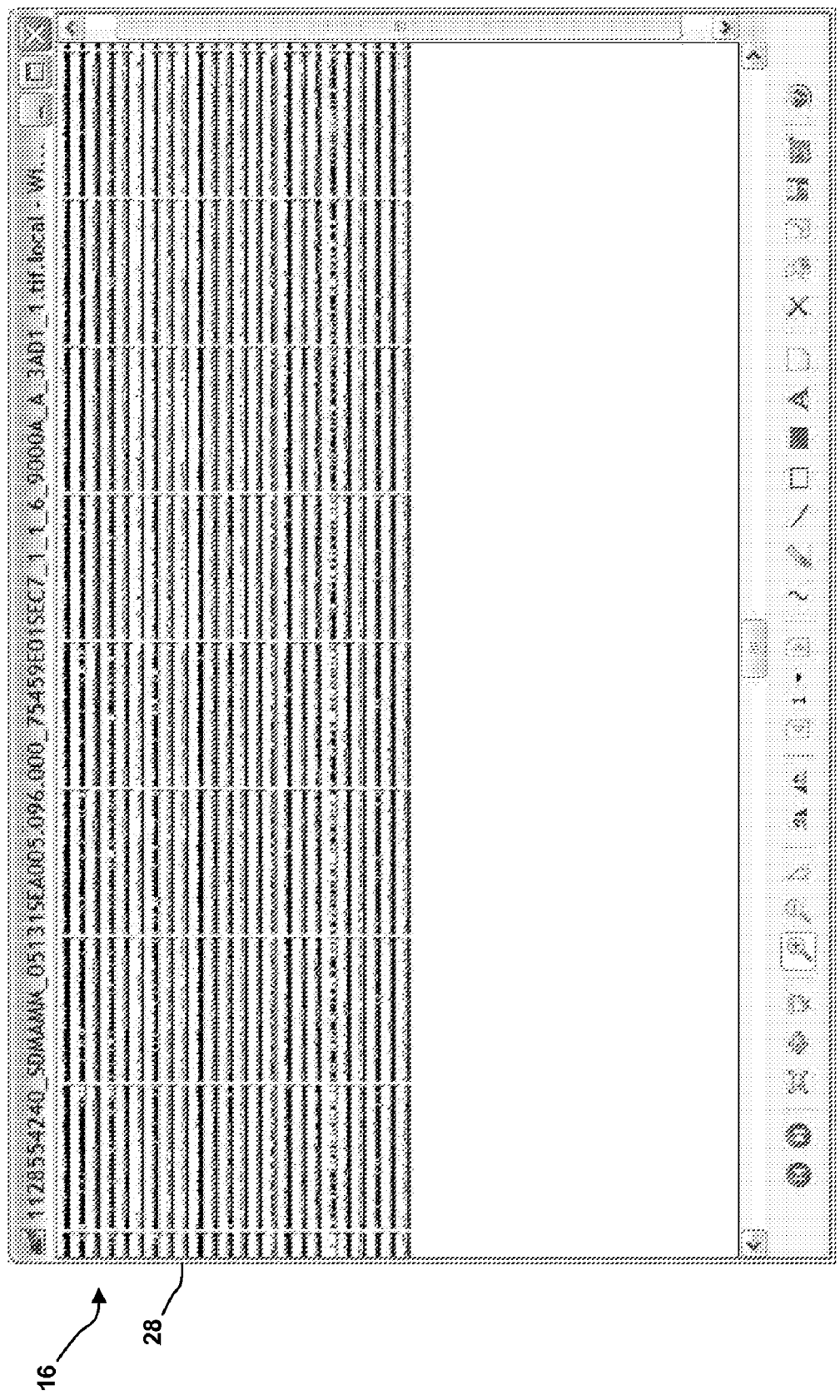
FIG. 3 depicts an enlarged view of a portion of the image file of FIG. 2.

A first illustrative image file 16 is depicted in FIG. 2. An enlarged view 28 of a portion 30 of the image file 16 of FIG. 2 is depicted in FIG. 3. A further enlarged view 32 of the portion 30 of the image file 16 is depicted in FIG. 4.

Figure 4:
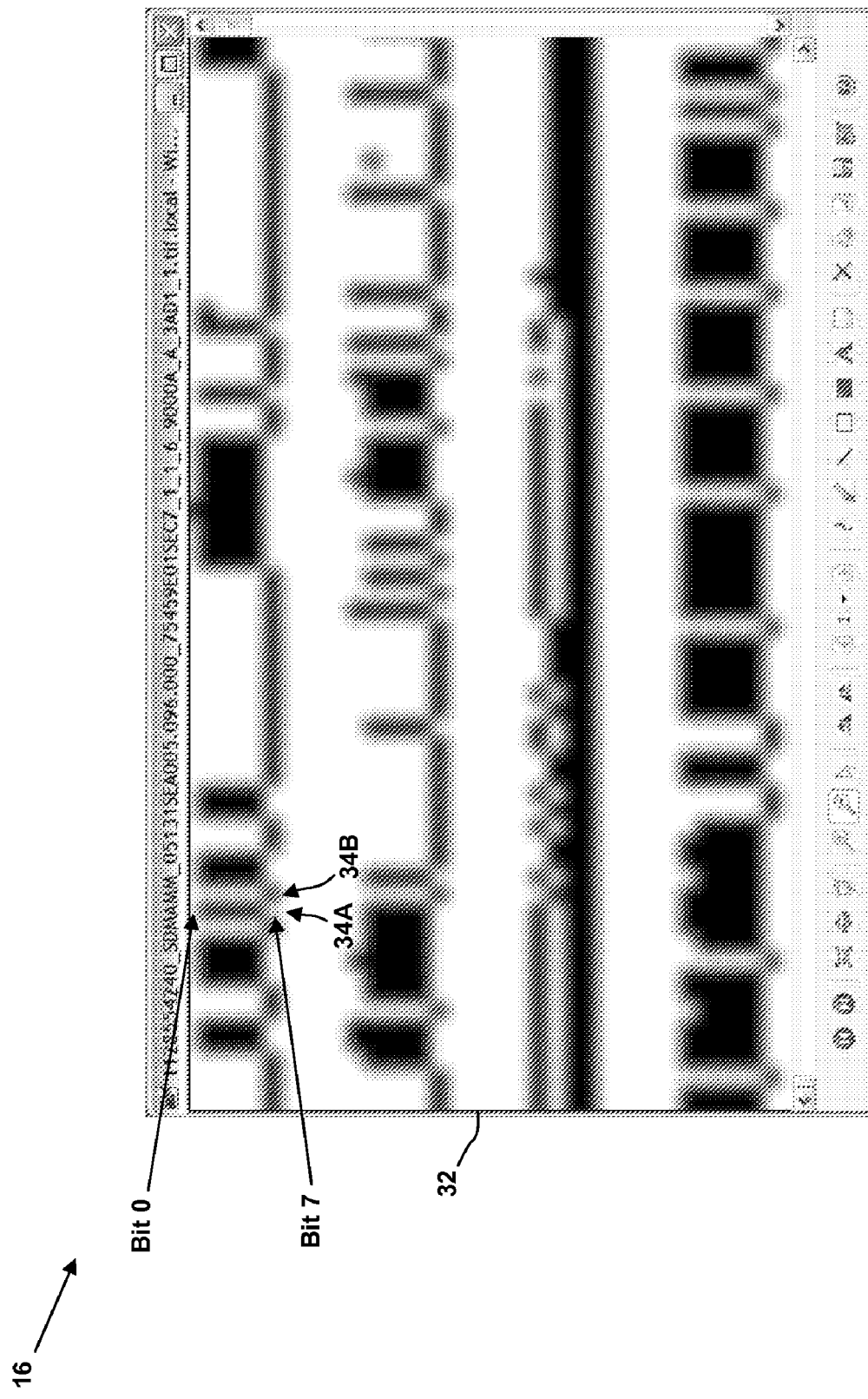
FIG. 4 depicts a further enlarged view of a portion of the image file of FIG. 2.

As shown most clearly in the enlarged view 32 of the image file 16 depicted in FIG. 4, each multi-bit integer value captured by the testing system 10 can be written to a multi-bit vertical field 34 in the image file 16. In this example, 8-bit resistance values, ranging from 0-255, have been written to a plurality of 10-bit vertical fields 34 (1-bit wide) in the image file 16. Vertical field 34A, for instance, contains the 8-bit value of 01111110 (126), while vertical field 34B contains the 8-bit value of 10000000 (128). In this way, using the multi-bit vertical fields 34, a large number of measurement values can be represented in the image file 16.

In FIG. 4, only bits 0 through 7 of each 10-bit vertical field 34 are used (bits 8 and 9 are unused). In general, however, given an M-bit multi-bit vertical field 34 and an N-bit multi-bit integer value captured by the testing system 10, then 1<N≦M.

The image file 16 is analyzed by the analysis system 18. To this extent, the extracting system 20 (FIG. 1) extracts the N-bit integer values from the multi-bit vertical fields 34 in the image file 16, based on predetermined location criteria 36 provided (A7), for example, in a table 38. The location criteria 36, which can be provided manually (e.g., entered by a user) or automatically (e.g., generated by a program), informs the extracting system 20 of the locations in the image file 16 where the N-bit integer values are to be extracted.

An example of an entry in the table 38 is listed below.
SDM1 10 0 7 98 2 16384 512 10000 270

Figure 5:
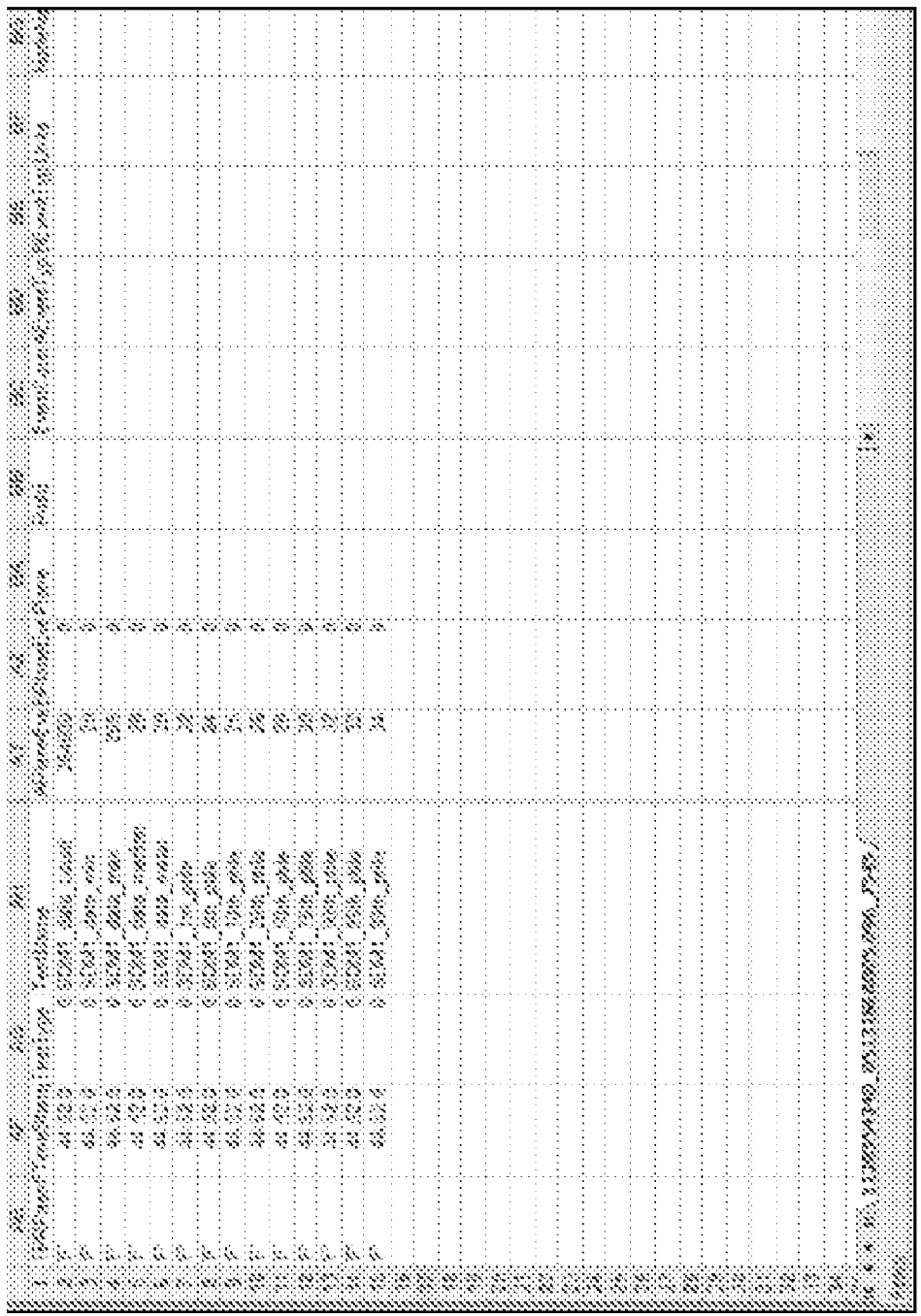
FIG. 5 depicts illustrative statistical information derived from the values extracted from an image file.

The fields in this entry are as follows:
SDM1—parameter name
10—vertical bit range
0—low bit
7—high bit
98—bit width of a horizontal set
2—skip count in a horizontal set
16384—total number of columns in image
512—total number of rows in image
10000—actual columns of data in image
270—actual rows of data in image Once extracted from the multi-bit vertical fields 34 in the image file 16, the N-bit integer values are analyzed by the analyzing system 24. The N-bit integer values can be analyzed for a wide variety of statistical information. For example, as depicted in FIG. 5, the N-bit integer values can be analyzed for the following information: min, max, median, mean, and 1, 5, 10, 25, 50, 75, 95, and 99 percentiles. Other statistical information can also be extracted from the N-bit integer values. The statistical analysis 26 of the N-bit integer values can be outputted (e.g., displayed, printed, and/or the like), stored in a data repository 40, and/or provided/used in any desired manner.

The image file 16 can be analyzed as a post-process to data generation and can be run as a parallel process as additional test data is captured. Further, data storage is reduced by writing the test data to the image file 16.

Figure 6:
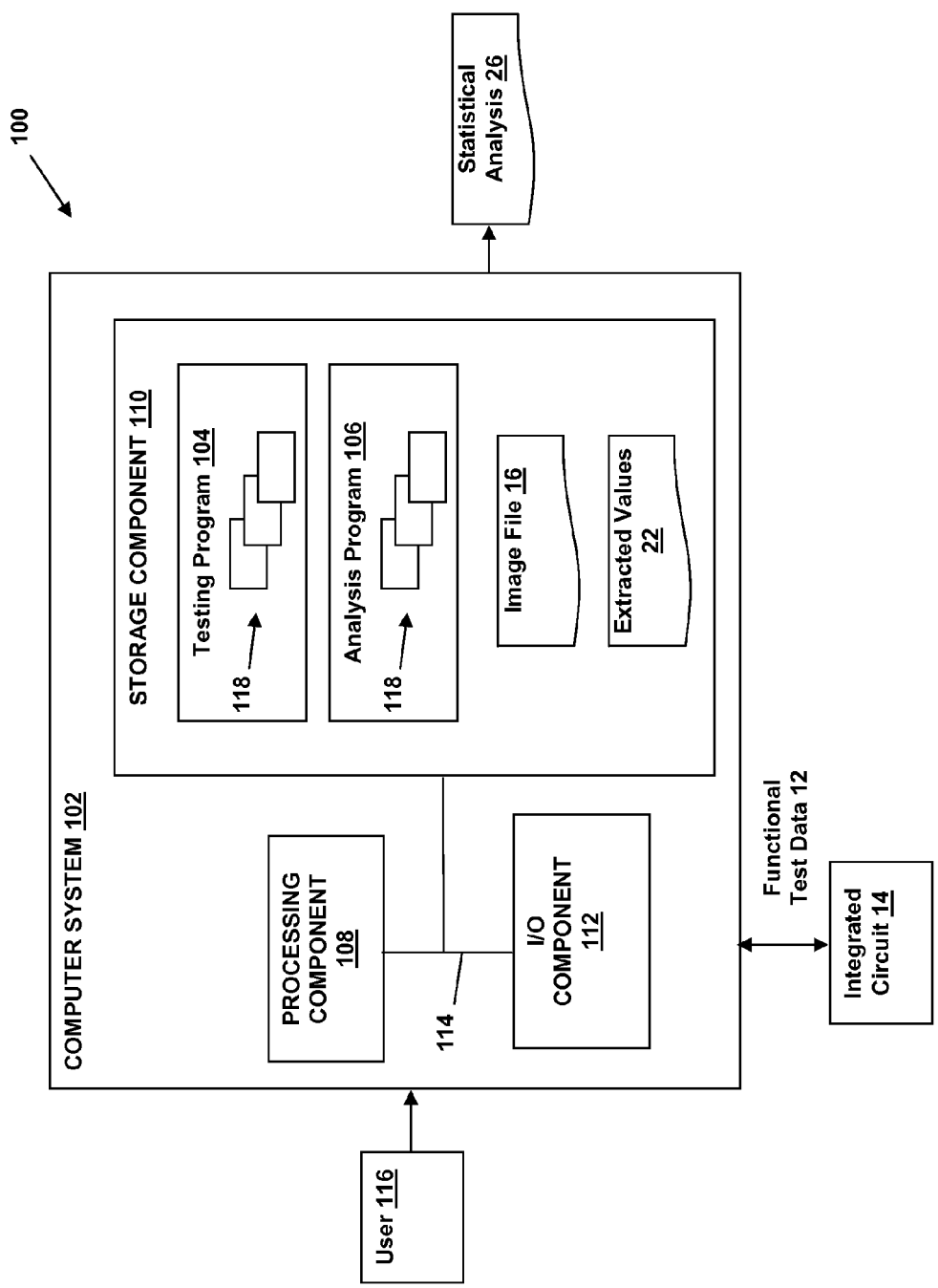
FIG. 6 depicts an illustrative environment for implementing embodiment(s) of the present disclosure.

FIG. 6 shows an illustrative environment 100 for capturing functional test data 12 of an integrated circuit 14, for generating an image file 16 containing the functional test data 12, for analyzing the image file 16 to extract values 22 from the image file 16, and for outputting a statistical analysis 26 of the extracted values 22, in accordance with any/all embodiments of the disclosure. To this extent, environment 100 includes a computer system 102 that can perform the processes described herein. In particular, the computer system 102 is shown as including a testing program 104, which makes computer system 102 operable to capture functional test data 12 of the integrated circuit 14 and to generate an image file 16 containing the functional test data 12, and an analysis program 106, which makes computer system 102 operable to analyze the image file 16 to extract values 22 from the image file and to generate and output a statistical analysis 26 of the extracted values 22, by performing the processes described herein.

The computer system 102 is shown including a processing component 108 (e.g., one or more processors), a storage component 110 (e.g., a storage hierarchy), an input/output (I/O) component 112 (e.g., one or more I/O interfaces and/or devices), and a communications pathway 114. In general, the processing component 108 executes program code, such as testing program 104 and analysis program 106, which are at least partially stored in storage component 110. While executing program code, the processing component 108 can read and/or write data to/from the storage component 110 and/or the I/O component 112. The communication pathway 114 provides a communications link between each of the components in computer system 102. The I/O component 112 can comprise one or more human I/O devices, which enable a human user 116 to interact with the computer system 102, and/or one or more communications devices to enable other computer system(s) to communicate with the computer system 102 using any type of communications link.

In any event, the computer system 102 can comprise one or more general purpose computing articles of manufacture (e.g., computing devices) capable of executing program code installed thereon. As used herein, it is understood that "program code" means any collection of instructions, in any language, code or notation, that cause a computing device having an information processing capability to perform a particular action either directly or after any combination of the following: (a) conversion to another language, code or notation; (b) reproduction in a different material form; and/or (c) decompression. To this extent, the testing program 104 and/or the analysis program 106 can be embodied as any combination of system software and/or application software. Further, the testing program 104 and/or analysis program 106 can be implemented using a set of modules 118. In this case, a module 118 can comprise a component that performs a set of actions used by the testing program 104 and/or analysis program 106. Further, it is understood that some of the actions discussed herein may not be implemented or additional actions may be implemented by computer system 102.

When the computer system 102 comprises multiple computing devices, each computing device can have only a portion of the testing program 104 and/or analysis program 106 installed thereon (e.g., one or more modules 118). However, it is understood that the computer system 102 is only representative of various possible equivalent computer systems that may implement the process described herein. To this extent, in other embodiments, the actions implemented by the computer system 102 can be at least partially implemented by one or more computing devices that include any combination of general and/or specific purpose hardware and/or program code. In each embodiment, the program code and hardware can be created using standard programming and engineering techniques, respectively.

Regardless, when the computer system 102 includes multiple computing devices, the computing devices can communicate over any type of communications link. Further, while performing the process described herein, the computer system 102 can communicate with one or more other computer systems using any type of communications link. In either case, the communications link can comprise any combination of various types of wired and/or wireless links; comprise any combination of one or more types of networks; and/or utilize any combination of various types of transmission techniques and protocols.

It is understood that each of the process flows shown and described herein is only illustrative. To this extent, numerous variations of these process flows are possible, and are included within the scope of this disclosure. Illustrative variations include performing one or more processes in parallel and/or a different order, performing additional processes, not performing some processes, and/or the like. To this extent, the computer system 102, testing program 104, and/or analysis program 106 can utilize multiple tasks/threads/processes to perform the actions of the processes described herein.

It is further understood that aspects of the disclosure further provide various alternative embodiments. For example, in one embodiment, the disclosure provides a computer program stored on at least one computer-readable medium, which when executed, enables a computer system to perform the processes described above. To this extent, the computer-readable medium can include program code, such as the testing program 104 and analysis program 106, which implement some or all of the process described herein. It is understood that the term "computer-readable medium" comprises one or more of any type of tangible medium of expression capable of embodying a copy of the program code (e.g., a physical embodiment). For example, the computer-readable medium can comprise: one or more portable storage articles of manufacture; one or more memory/storage components of a computing device; a modulated data signal having one or more of its characteristics set and/or changed in such a manner as to encode information in the signal; paper; and/or the like.

In another embodiment, a computer system, such as the computer system 102, can be obtained (e.g., created, maintained, made available, etc.) and one or more programs/systems for performing the process described herein can be obtained (e.g., created, purchased, used, modified, etc.) and deployed to the computer system. To this extent, the deployment can comprise one or more of: (1) installing program code on a computing device from a computer-readable medium; (2) adding one or more computing devices to the computer system; and (3) incorporating and/or modifying the computer system to enable it to perform the process described herein.

Aspects of the present disclosure can be also implemented as part of a business method that performs the process described herein on a subscription, advertising, and/or fee basis. That is, a service provider could offer to capture functional test data of an integrated circuit, generate an image file containing the functional test data, analyze the image file to extract values from the image file, and/or output a statistical analysis of the extracted values, as described herein. In this case, the service provider can manage (e.g., create, maintain, support, etc.) some or all of the environment 100, such as the computer system 102, that performs the process described herein for one or more customers. In return, the service provider can receive payment from the customer(s) under a subscription and/or fee agreement; receive payment from the sale of advertising to one or more third parties, and/or the like.

The foregoing description of the preferred embodiments of this disclosure has been presented for purposes of illustration and description. It is not intended to be exhaustive or to limit the disclosure to the precise form disclosed, and obviously, many modifications and variations are possible.

What is claimed is:

1. A method for capturing and analyzing test data, comprising:
using at least one computing device for:
capturing multi-bit integer values of test data;
writing each multi-bit integer value to a one-bit wide, multi-bit vertical field in an image file;
obtaining location criteria identifying locations in the image file of the multi-bit vertical fields from which the multi-bit integer values are to be extracted;
extracting the multi-bit integer values from the multi-bit vertical fields in the image file based on the location criteria; and
analyzing the extracted multi-bit integer values.

2. The method of claim 1, further comprising:
performing a test on an integrated circuit; and
capturing the multi-bit integer values at a number of points on the integrated circuit.

3. The method of claim 2, wherein the multi-bit values comprise an
electrical characteristic of the integrated circuit.

4. The method of claim 3, wherein the electrical characteristic is
selected from the group consisting of resistance, voltage, current, inductance, capacitance, and power.

5. The method of claim 1, further comprising:
outputting a statistical analysis of the extracted multi-bit integer values.

6. A system for capturing and analyzing test data, comprising:
a testing system for capturing multi-bit integer values of test data, and for writing each multi-bit integer value to a one-bit wide, multi-bit vertical field in an image file; and
an analyzing system for obtaining location criteria identifying locations in the image file of the multi-bit vertical fields from which the multi-bit integer values are to be extracted, for extracting the multi-bit integer values from the multi-bit vertical fields in the image file based on the location information, and for analyzing the extracted multi-bit integer values.

7. The system of claim 6, further comprising:
a system for performing a test on an integrated circuit; and
a system for capturing the multi-bit integer values at a number of points on the integrated circuit.

8. The system of claim 7, wherein the multi-bit values comprise an electrical characteristic of the integrated circuit.

9. The system of claim 8, wherein the electrical characteristic is selected from the group consisting of resistance, voltage, current, inductance, capacitance, and power.

10. The system of claim 6, further comprising:
a system for outputting a statistical analysis of the extracted multi-bit integer values.

11. A program product stored on a computer readable storage medium, which when executed by a computing device, captures and analyzes test data, the computer readable storage medium comprising program code for:
capturing multi-bit integer values of test data;
writing each multi-bit integer value to a one-bit wide, multi-bit vertical field in an image file;
obtaining location criteria identifying locations in the image file of the multi-bit vertical fields from which the multi-bit integer values are to be extracted;
extracting the multi-bit integer values from the multi-bit vertical fields in the image file based on the location criteria; and
analyzing the extracted multi-bit integer values.

12. The program product of claim 11, further comprising program code for:
performing a test on an integrated circuit; and
capturing the multi-bit integer values at a number of points on the integrated circuit.

13. The program product of claim 12, wherein the multi-bit values comprise an electrical characteristic of the integrated circuit.

14. The program product of claim 13, wherein the electrical characteristic is selected from the group consisting of resistance, voltage, current, inductance, capacitance, and power.

15. The program product of claim 11, further comprising program code for:

outputting a statistical analysis of the extracted multi-bit integer values.

* * * * *